United States Patent [19]

Paolella

[11] Patent Number: 5,086,281
[45] Date of Patent: Feb. 4, 1992

[54] OPTICAL CONTROL CIRCUIT FOR A MICROWAVE MONOLITHIC INTEGRATED CIRCUIT

[75] Inventor: Arthur Paolella, Howell, N.J.

[73] Assignee: The United States of America as represented by the Secretary of the Army, Washington, D.C.

[21] Appl. No.: 664,237

[22] Filed: Mar. 4, 1991

[51] Int. Cl.⁵ .............................. H03G 3/30
[52] U.S. Cl. ...................... 330/279; 330/59; 330/277; 330/285; 330/308
[58] Field of Search .............. 330/59, 285, 307, 308, 330/279; 307/311; 250/214 A, 214 AG

[56] References Cited

U.S. PATENT DOCUMENTS 4,859,965 8/1989 Paolella et al. ............. 330/285

FOREIGN PATENT DOCUMENTS 3505186 8/1986 Fed. Rep. of Germany ...... 330/308

Primary Examiner—James B. Mullins
Attorney, Agent, or Firm—Michael Zelenka; William H. Anderson

[57] ABSTRACT

A GaAs MESFET coupled to an interdigited photoconductive detector uses the internal gain of the interdigited photoconductive conductor and the transconductance of the MESFET to convert an optical control signal to an electrical current control signal which in turn is used to control a GaAs MMIC.

8 Claims, 1 Drawing Sheet

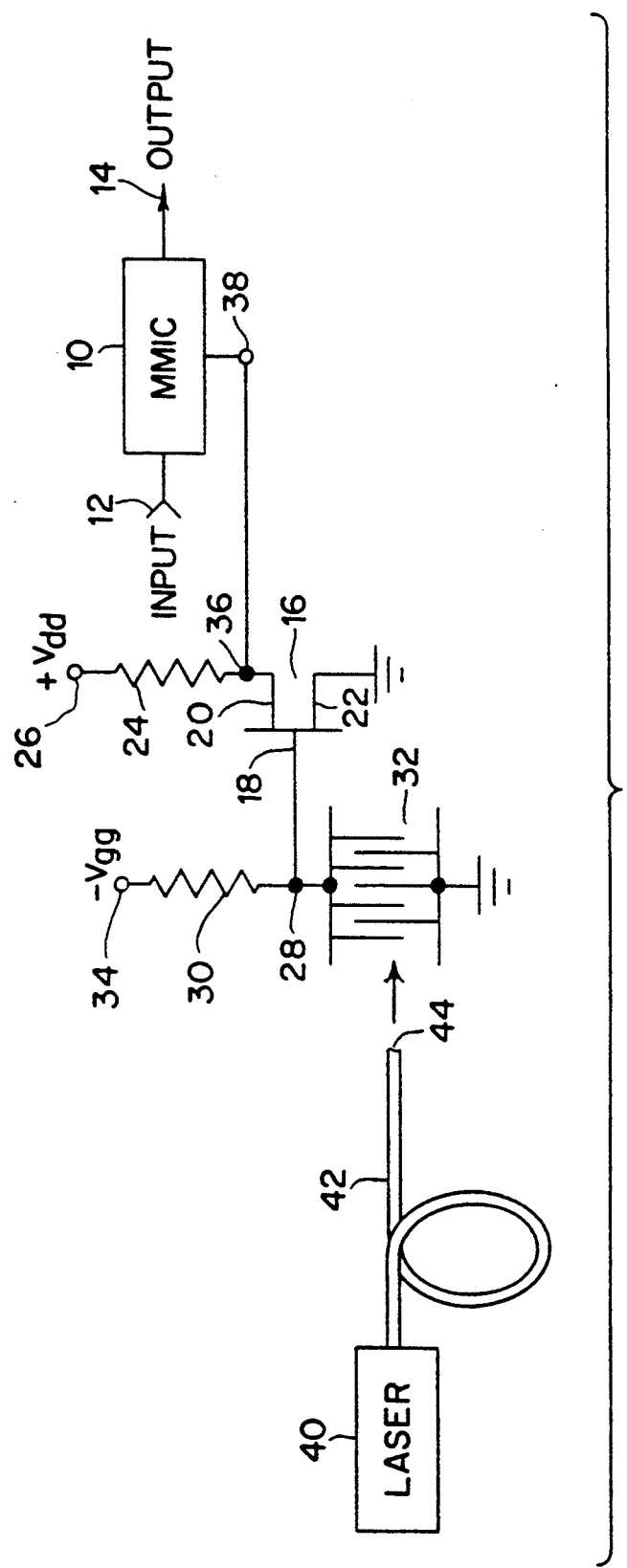

OPTICAL CONTROL CIRCUIT FOR A MICROWAVE MONOLITHIC INTEGRATED CIRCUIT

GOVERNMENT INTEREST

The invention described herein may be manufactured, used, and licensed by or for the Government for governmental purposes without the payment to me of any royalties thereon or therefor.

BACKGROUND OF THE INVENTION

1. Field of the Invention

This invention relates to means for controlling a microwave circuit and more particularly to an optically controlled MESFET using an interdigited photoconductive detector for controlling microwave circuit functions by optical means.

2. Description of the Prior art

Conventional distribution networks such as coaxial transmission lines and metallic waveguides are bulky and susceptible to radiation environments. Optical wave guides such as fiber optics have become a viable means for the distribution of microwave signals and control signals. This is principally due to two causes, first the low cost of optical fibers, and secondly, the increased operational speed of lasers and photodetectors. Distributing the various control signals by optical fibers has many desirable features such as high speed, large bandwidth, good electrical isolation and elimination of grounding problems. Also, optical fibers are relatively light in weight and can be configured in relatively small sizes.

Optically controlling microwave circuit functions such as gain, phase or switching requires detection and amplification of optical signals. Additionally, optical detectors must be compatible with gallium arsenide (GaAs) microwave monolithic integrated circuit (MMIC) fabrication techniques to provide monolithic integration of optical and microwave components. Known prior art apparatus used GaAs MESFETs as an optical detector with additional amplification stages to provide control of gain, phase and switching of microwave circuits. Such apparatus is shown and described, for example, in U.S. Pat. No. 4,859,965, entitled, "Optical Gain Control Of GaAs Microwave Monolithic Integrated Circuit Distributed Amplifier", issued to Arthur Paolella et al on Aug. 22, 1989.

SUMMARY OF THE INVENTION

It is an object of the present invention, therefore, to provide an improvement in the control of microwave circuitry.

It is another object of the invention to control a microwave circuit in a relatively high electromagnetic interference type of an environment.

It is a further object of the invention to provide a microwave control circuit utilizing GaAs devices.

And it is still another object of the invention to remotely control a microwave monolithic integrated circuit amplifier with an optical signal transmitted via an optical fiber.

Briefly, the foregoing and other objects are achieved by an optically controlled GaAs MESFET using an interdigited photoconductive detector which eliminates the need for amplification stages by using the internal gain mechanism of the interdigited photoconductive conductor and the transconductance of the MESFET to convert the optical signal to an electrical current which in turn is used to control a microwave monolithic integrated amplifier circuit.

BRIEF DESCRIPTION OF THE DRAWING

The following detailed description of the invention will be more readily understood when considered together with the accompanying drawing wherein the FIG. is a schematic circuit diagram illustrative of the preferred embodiment of the invention

DETAILED DESCRIPTION

Referring now to the drawing, there is shown a gallium arsenide (GaAs) microwave monolithic integrated circuit (MMIC) 10 which includes a microwave input port 12 and an output port 14. Microwave circuit functions of the MMIC 10 are controlled by the output from a field effect transistor 16 in the form of a (GaAs) MESFET.

The MESFET 16 includes a gate electrode 18, a drain electrode 20, and an source electrode 22. As shown, a load resistor 24 is connected between the drain electrode 20 and a power supply terminal 26 for the application of a positive supply voltage $+V_{dd}$. The gate electrode 18 is coupled to a circuit node 28 between a gate bias resistor 30 and ann interdigited photoconductive detector device 32. The bias resistor 30 is connected to a second power supply terminal 34 which is connected to a negative source of supply voltage $-V_{gg}$. The opposite side of the resistor 30 is connected to the interdigited photoconductive detector 32 at node 28 which is also shown connected to a point of reference potential e.g. ground potential. The fixed resistor 30 and the detector 32 form a voltage divider for the application of a bias voltage to the gate 18. The output signal of the MESFET 16 is taken from the circuit node 36 between the drain 20 and the load resistor 24 and coupled to a control terminal 38 of the MMIC 10.

Further as shown in the drawing, a source of optical control energy in the form of a laser 40 is coupled to one end of a fiber optic cable 42 whose far end directs optical energy onto the photoconductor detector 32.

In operation, an optical control signal from the laser 40 is transmitted via the fiber optic cable 42 to the interdigited photoconductive detector 32. The detector 32 converts the optical signal to an electrical photocurrent $I_{ph}$ which is amplified by the internal photoconductive gain G of the device itself which can be expressed as:

$$G = \text{carrier lifetime/transit time} \quad (1)$$

Gains of 10 to 1000 can be obtained. The detected photocurrent $I_{ph}$ can be expressed as:

$$I_{ph} = q \times F \times G \quad (2)$$

where q is the electron charge, F is the photon flux density and G is the gain. The photocurrent $I_{ph}$ in the detector 32 changes the voltage across resistor 30, thus changing the gate voltage $V_g$ appearing on the gate electrode 18 of the MESFET 16. Where R is the magnitude of the resistor 30, the voltage change $\Delta V_g$ across the resistor can be expressed as:

$$\Delta V_g = R \times I_{ph} \quad (3)$$

which can be rearranged as:

$$\Delta V_g = R \times q \times F \times G \quad (4)$$

The voltage change $\Delta V_g$ is next amplified by the transconductance g of the MESFET 16 according to the expression:

$$\Delta I_d = g_m \times \Delta V_g = g_m = R = q = F = G \quad (5)$$

The change in drain current $I_d$ now becomes a function of the optical signal power.

Whereas the prior art such as disclosed in the above-referenced U.S. Pat. No. 4,859,965 uses a GaAs MESFET as an optical detector with additional amplification bias to the MESFET gate electrode 18 is set so that the drain circuit is a high resistance (pinch off). When optical energy is sensed, the MESFET 16 conducts, providing a low resistance (saturation).

Thus what has been shown and described is a microwave control circuit utilizing the internal gain mechanism of an interdigited photoconductive detector and the transconductance of a MESFET to convert an optical control signal to an electrical control signal.

Having thus shown and described what is at present considered to be the preferred embodiments of the invention, it should be noted that the same has been made by way of illustration and not limitation. Accordingly, all modifications, alterations and changes coming within the spirit and scope of the invention as set forth in the appended claims are herein meant to be included.

What is claimed is:

1. An optical control circuit for controlling a microwave monolithic integrated circuit, comprising:
    a light source generating an optical control signal;
    an interdigited photoconductive detector responsive to said optical control signal and having an internal gain to generate an electrical control signal from said optical control signal;
    optical energy conductor means coupled to said light source for directing said optical control signal to said detector;
    field effect transistor means having a predetermined transconductance between an input electrode and an output electrode;
    circuit means coupled to said input electrode for controlling the current between said input electrode and said output electrode of the field effect transistor as a function of the electrical control signal generated by said detector; and
    circuit means coupling said output electrode to the microwave monolithic integrated circuit,
    whereby the internal gain of the interdigited photoconductive detector and the transconductance of the field effect transistor operate to generate an output signal for controlling the microwave monolithic integrated circuit.

2. The optical control circuit as claimed in claim 1 wherein said circuit means for controlling the current further includes at least one electrical resistor coupled to said interdigited photoconductive detector across a source of bias voltage.

3. The optical control circuit as claimed in claim 2 wherein said at least one electrical resistor and said detector are connected in series to form a voltage divider and having a circuit node coupled to said input electrode of said field effect transistor.

4. The optical control circuit as claimed in claim 3 wherein said field effect transistor includes gate, drain, and source electrodes and wherein said gate electrode comprises the input electrode and the drain electrode comprises the output electrode.

5. The optical control circuit as claimed in claim 4 wherein said field effect transistor comprises a MESFET.

6. The optical control circuit as claimed in claim 4 wherein said field effect transistor comprises a GaAs MESFET.

7. The optical control circuit as claimed in claim 4 wherein said light source comprises a laser type control source.

8. The optical control circuit as claimed in claim 7 and wherein said optical energy conductor means comprises an optical fiber.

* * * * *